United States Patent
Sun et al.

(10) Patent No.: US 12,439,624 B2
(45) Date of Patent: Oct. 7, 2025

(54) METHOD OF MANUFACTURING SEMICONDUCTOR DEVICES INCLUDING FORMING AN AIR GAP BASED ON REMOVING A RECESSED SACRIFICIAL LAYER

(71) Applicant: TAIWAN SEMICONDUCTOR MANUFACTURING COMPANY, LTD., Hsinchu (TW)

(72) Inventors: Chih-Hung Sun, Hsinchu (TW); Po-Hsien Cheng, Hsinchu (TW); Zhen-Cheng Wu, Hsinchu (TW); Chi-On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 513 days.

(21) Appl. No.: 17/745,124

(22) Filed: May 16, 2022

(65) Prior Publication Data
US 2023/0369462 A1    Nov. 16, 2023

(51) Int. Cl.
*H10D 30/01* (2025.01)
*H10D 30/62* (2025.01)
*H10D 62/10* (2025.01)
*H10D 84/01* (2025.01)
*H10D 84/03* (2025.01)
*H10D 84/83* (2025.01)

(52) U.S. Cl.
CPC ....... *H10D 30/024* (2025.01); *H10D 30/6211* (2025.01); *H10D 62/115* (2025.01); *H10D 84/0151* (2025.01); *H10D 84/0158* (2025.01); *H10D 84/038* (2025.01); *H10D 84/834* (2025.01)

(58) Field of Classification Search
CPC .......... H01L 29/66795; H01L 29/0649; H01L 21/823431; H01L 21/823807; H01L 27/08886; H10D 30/24; H10D 30/6211; H10D 62/115; H10D 84/01515; H10D 84/0158; H10D 84/834; H10D 84/853; H10D 84/0193; H10D 30/024; H10D 84/0151
See application file for complete search history.

(56) References Cited

U.S. PATENT DOCUMENTS

| | | | |
|---|---|---|---|
| 10,256,302 B2 * | 4/2019 | Cheng | H01L 29/42392 |
| 2016/0093717 A1 * | 3/2016 | Oh | H10B 12/053 |
| | | | 438/270 |
| 2017/0133375 A1 * | 5/2017 | Fung | H10D 84/0167 |
| 2017/0287922 A1 * | 10/2017 | Li | H01L 21/762 |
| 2019/0164766 A1 * | 5/2019 | Huang | H10D 84/853 |
| 2020/0152736 A1 * | 5/2020 | Yu | H01L 21/764 |
| 2021/0193566 A1 * | 6/2021 | Lo | H01L 21/7682 |
| 2022/0319928 A1 * | 10/2022 | Shen | H01L 29/66795 |
| 2022/0384569 A1 * | 12/2022 | More | H01L 29/7851 |

* cited by examiner

*Primary Examiner* — Khiem D Nguyen
(74) *Attorney, Agent, or Firm* — STUDEBAKER BRACKETT PLLC

(57) ABSTRACT

In a method of manufacturing a semiconductor device, a metal gate structure is formed and cut into two pieces of metal gate structures by forming a gate end spaces. A first liner layer is formed in the gate end space, and a sacrificial layer is formed on the first liner layer, and recessed. A second liner layer is formed over the recessed sacrificial layer, an air gap is formed by removing the recessed sacrificial layer; and a third liner layer is formed over the second liner layer.

20 Claims, 15 Drawing Sheets

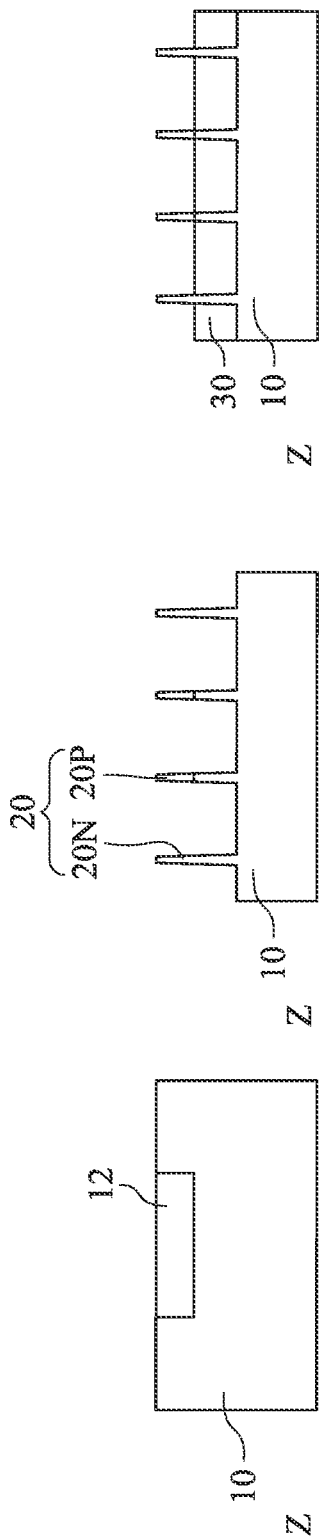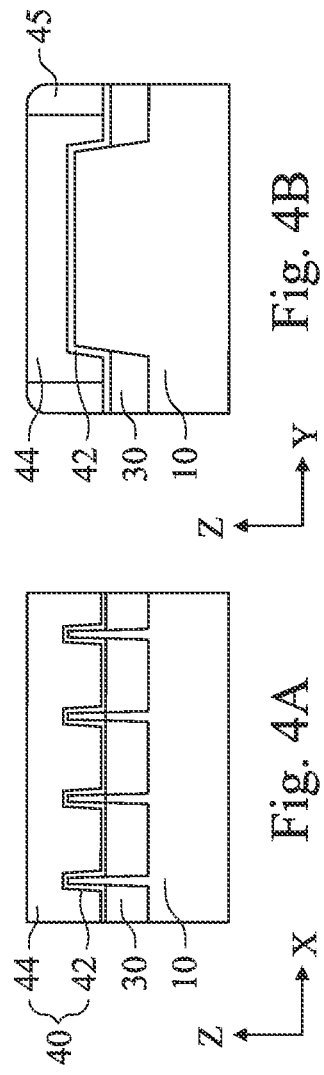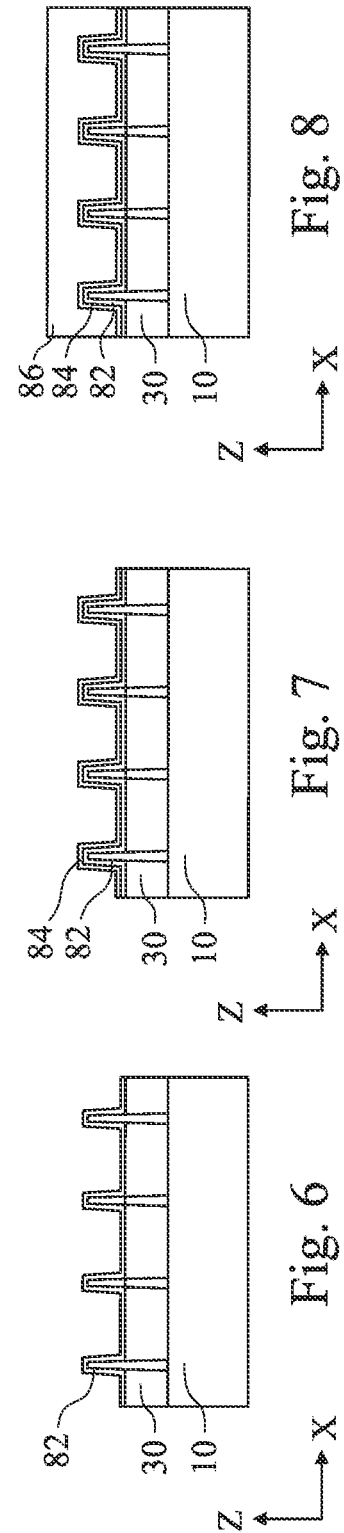

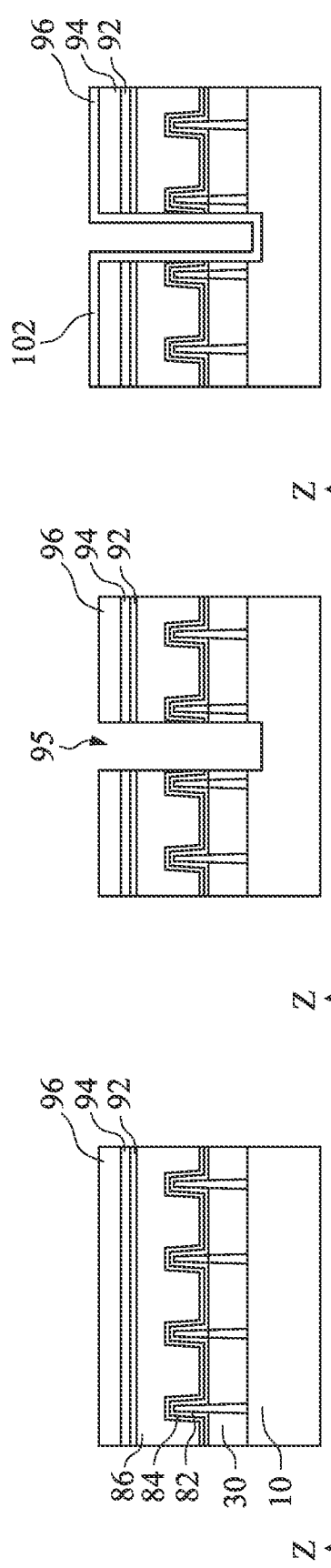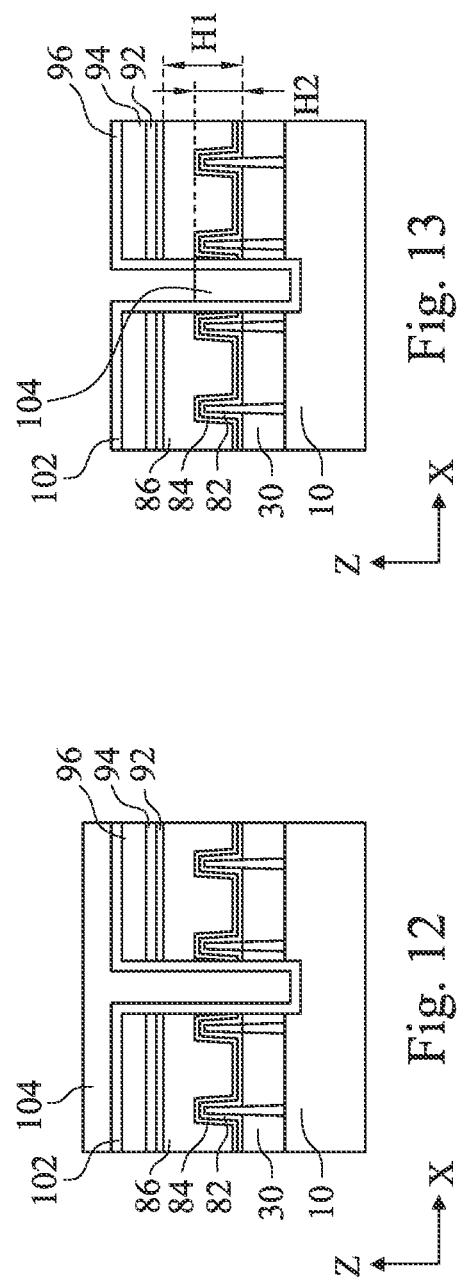

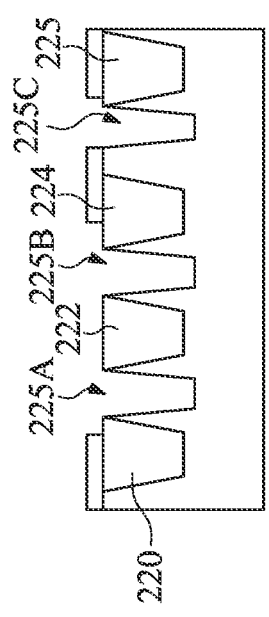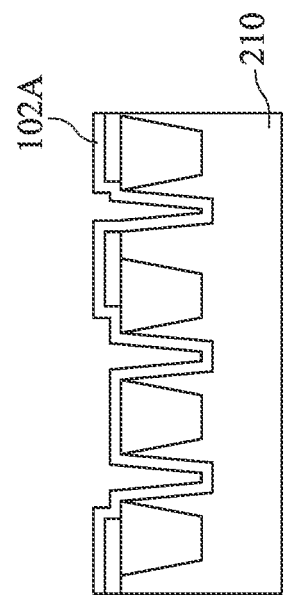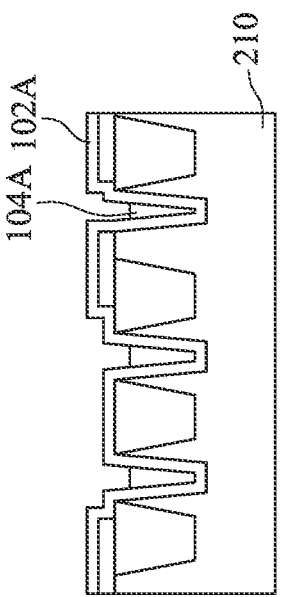

METHOD OF MANUFACTURING SEMICONDUCTOR DEVICES INCLUDING FORMING AN AIR GAP BASED ON REMOVING A RECESSED SACRIFICIAL LAYER

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1, 2, 3, 4A, 4B, 5, 6, 7, 8, 9, 10, 11, 12, 13, 14, 15, 16, 17 and 18 show various views of a sequential manufacturing process for a semiconductor device according to an embodiment of the present disclosure.

FIGS. 27, 28, 29, 30, 31, 32, 33, 34, 35, 36, 37 and 38 show various views of a sequential manufacturing process for a semiconductor device according to an embodiment of the present disclosure.

DETAILED DESCRIPTION

Figure 14:
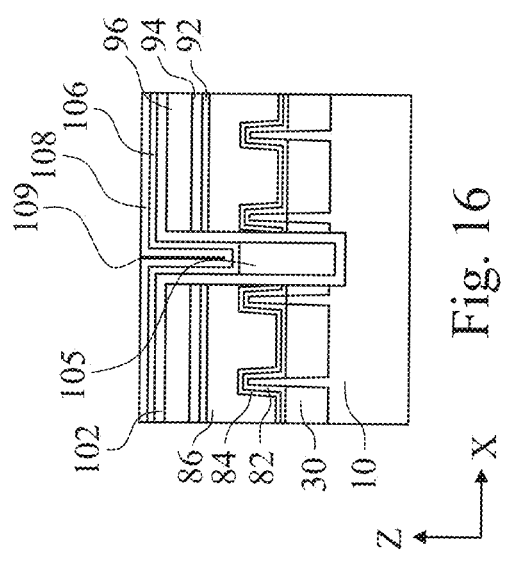

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure. In some embodiments of the present disclosure, metal gates are separated along their extending direction by a gate separation structure.

In current technology, performing gate end cuts and refilling the cut spaces with silicon nitride introduces an increase in extrinsic capacitance because $Si_3N_4$ has a larger dielectric constant. Moreover, the end cut process before dummy gate removal constrains the dummy poly/oxide removal and the interfacial layer (IL), high-k dielectric (HK), metal gate (MG) refill window.

In embodiments of the present disclosure, the gate separation structure (also called as an end cut isolation layer/material) includes one or more layers of dielectric material and an air gap. Embodiments of the disclosure provide a reduced cell extrinsic capacitance from the end cut isolation.

FIGS. 1-18 show various stages of a sequential manufacturing operation of a semiconductor device according to an embodiment of the present disclosure. It is understood that additional operations can be provided before, during, and after the operations of FIGS. 1-18, and some of the operations described below can be replaced or eliminated for additional embodiments of the method. The order of the operations/processes may be interchangeable.

In some embodiments, a FinFET device includes a CMOS device having an n-type FET (NFET) and a p-type FET (PFET). In some embodiments, the channel regions of the NFET and the PFET are made of the same semiconductor material, such as Si or SiGe. In other embodiments, the channel regions of the NFET and the PFET are made of different semiconductor materials, such as Si for the NFET and SiGe for the PFET.

When the channel regions of the NFET is made of Si and the PFET is made of SiGe, an epitaxial layer 12 made of SiGe is formed over a substrate 10 as shown in FIG. 1. In some embodiments, a part of the substrate 10 made of Si is etched and a SiGe layer 12 is epitaxially formed in the etched portion (opening) of the substrate 10. In other embodiments, the SiGe layer is epitaxially formed over the substrate 10, a part of the SiGe layer is etched, and a Si epitaxial layer is formed. Other processes to form the SiGe layer 12 over the substrate 10 can be applied.

The substrate 10 is, for example, a p-type silicon substrate with an impurity concentration in a range from about $1\times10^{15}$ cm$^{-3}$ to about $5\times10^{15}$ cm 3. In other embodiments, the substrate is an n-type silicon substrate with an impurity concentration in a range from about $1\times10^{15}$ cm$^{-3}$ to about $5\times10^{15}$ cm$^{-3}$. In one embodiment, the substrate 10 is a silicon layer of an SOI (silicon-on insulator) substrate.

Then, one or more fin structures 20 are formed over the substrate as shown in FIG. 2. By using one or more lithography and etching operations, the substrate 10 with the epitaxial layer 12 is patterned into the fin structures. In some embodiments of the present disclosure, the fin structures 20 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In some embodiments, the fin structures 20 includes n-type fin structures 20N for n-type FETs and p-type fin structures 20P for p-type FETs. In some embodiments, the n-type fin structures 20N are made of the same material as the substrate 10 (e.g., Si) and the p-type fin structures 20P have channel region made of a different material (e.g., $Si_{1-x}Ge_x$, where $0.2<x<0.6$ in some embodiments) than the substrate 10. In some embodiments, one or more dummy fin structures (not shown) are formed on both sides of the fin structures 20 to improve pattern fidelity in the patterning operations.

After the fin structures 20 are formed, an insulating material layer including one or more layers of insulating material is formed over the substrate 10 so that the fin structures 20 are fully embedded in the insulating material layer. The insulating material for the isolation insulating layer 30 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted, and the flowable film is cured and annealed more than once. The isolation insulating layer 30 may be SOG, $SiO_2$, SiON, SiOCN or fluorine-doped silicate glass (FSG). The isolation insulating layer 30 may be doped with boron and/or phosphorous. Then, a planarization operation, such as a chemical mechanical polishing (CMP) method and/or an etch-back method, is performed such that the upper surface of the fin structures 20 is exposed from the insulating material layer. Then, the insulating material layer is recessed to form an isolation insulating layer (also called shallow trench isolation (STI)) so that the upper portions of the fin structures 20 are exposed as shown in FIG. 3.

After the isolation insulating layer 30 is formed, a sacrificial gate dielectric layer 42 is formed on the upper portions of the fin structures (channel regions 20N and 20P) and the upper surface of the isolation insulating layer 30. The sacrificial gate dielectric layer 42 includes one or more layers of insulating material. In some embodiments, $SiO_2$ is used. In one embodiment, silicon oxide is formed by chemical vapor deposition (CVD), including low pressure CVD (LPCVD) and plasma enhanced CVD (PECVD), physical vapor deposition (PVD), atomic layer deposition (ALD), or other suitable process. The thickness of the sacrificial gate dielectric layer 42 is in a range from about 1 nm to about 5 nm in some embodiments of the present disclosure. Further, a sacrificial gate electrode layer 44 is formed over the sacrificial gate dielectric layer 42. Then, one or more hard mask layers are formed over the sacrificial gate electrode layer 44. In some embodiments, the sacrificial gate electrode layer 44 is made of poly silicon or amorphous silicon.

Then, by using one or more lithography and etching operations, the sacrificial gate electrode layer (poly silicon layer) is patterned so as to obtain a sacrificial gate structure 40, as shown in FIGS. 4A and 4B. FIG. 4B is a cross sectional view along the Y direction (source-to-drain direction). After patterning the poly silicon layer, gate sidewall spacers 45 are formed at both side faces of the sacrificial gate structure 40, as shown in FIGS. 4A and 4B. The gate sidewall spacers 45 are made of one or more layers of silicon oxide or silicon nitride based materials such as silicon oxide, SiN, SiCN, SiON or SiOCN, or aluminum based insulating material. In one embodiment, multiple layers are used. In some embodiments, the gate sidewall spacers 45 have thickness of about 2 nm to about 8 nm.

After the sacrificial gate structure 40 with the gate sidewall spacers 45 is formed, one or more source/drain epitaxial layers are formed over source/drain regions of the fin structures. In some embodiments, the source/drain epitaxial layer is individually formed over the fin structures 20N, 20P, respectively, without merging the adjacent source/drain epitaxial layer. In other embodiments, the adjacent source/drain epitaxial layers are merged to form a merged epitaxial layer.

In some embodiments, the source/drain regions of the fin structures 20 are recessed down below the upper surface of the isolation insulating layer 30, and then the epitaxial layer is formed on the recessed fin structures.

After the source/drain epitaxial layers are formed, a first interlayer dielectric (ILD) layer is formed. In some embodiments, before forming the first ILD layer, an etch stop layer (ESL) is formed over the source/drain epitaxial layers and the gate sidewall spacers 45. The ESL is made of silicon nitride or a silicon nitride-based material (e.g., SiON, SiCN or SiOCN). The materials for the first ILD layer include compounds comprising Si, O, C and/or H, such as silicon oxide, SiCOH and SiOC. Organic materials, such as polymers, may be used for the first ILD layer. In some embodiments, after the first ILD layer is formed, a planarization operation, such as an etch-back process and/or a chemical mechanical polishing (CMP) process, is performed to expose the upper surface of the sacrificial gate electrode layers 44.

The sacrificial gate structures 40 are subsequently removed by one or more appropriate etching operations to form gate spaces 65 surrounded by the gate sidewall spacer 45. When the sacrificial gate electrode layer 44 is polysilicon, a wet etchant such as a tetramethylammonium hydroxide (TMAH) solution can be used to selectively remove the sacrificial gate electrode layer 44. Further, the sacrificial gate dielectric layer 42 is thereafter removed using plasma dry etching and/or wet etching, thereby exposing the upper portion of the fin structures 20N, 20P, as shown in FIG. 5.

After the upper portion of the fin structures 20 are exposed, metal gate structure is formed. In the gate space 65, a gate dielectric layer including an interfacial layer and a high-k gate dielectric layer 82 are formed on the exposed fin structures (channel layers) 20N, 20P as shown in FIG. 6. The interfacial layer is a chemically formed silicon oxide in some embodiments. The chemical silicon oxide may be formed using deionized water+ozone ($DIO_3$), $NH_4OH+H_2O_2+H_2O$ (APM), or other methods. The high-k gate dielectric layer 82 includes one or more layers of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials. The high-k gate dielectric layer 82 may be formed by CVD, ALD or any suitable method. In one embodiment, the high-k gate dielectric layer 82 is formed using a highly conformal deposition process such as ALD in order to ensure the formation of a gate dielectric layer having a uniform thickness around each channel layer. The thickness of the high-k gate dielectric layer 82 is in a range from about 1 nm to about 10 nm in some embodiments. As shown in FIG. 6, the high-k gate dielectric layer 82 in formed on the upper surface of the isolation insulating layer 30 in some embodiments.

In some embodiments, one or more work function adjustment layers 84 are formed over the gate dielectric layer 82, as shown in FIG. 7, and a main metal layer 86 is formed over the work function adjustment layers 84, as shown in FIG. 8. In some embodiments, the main metal layer 86 includes a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the main metal layer includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the main metal layer for an n-type FET and the main metal layer for p-type FET are made of the same material. The work function adjustment layer and the main metal layer may be formed using a suitable process such as atomic layer deposition (ALD), chemical vapor deposition (CVD), physical vapor deposition (PVD), plating, or combinations thereof, and then are subjected to a planarization operation, such as CMP to flatten the upper surface thereof.

Then, as shown in FIG. 9, one or more hard mask layers are formed. In some embodiments, the hard mask layer includes a first hard mask layer 92 made of silicon nitride or SiON, a second hard mask layer 94 made of Si (polysilicon or amorphous silicon), and a third hard mask layer 96 made of silicon nitride or SiON. The hard mask layers are formed using a suitable process such as ALD or CVD, including plasma enhanced CVD (PECVD). In some embodiments, the thickness of the third hard mask layer 96 is greater than the thickness of the first and/or second hard mask layers 92, 94.

Then, by using one or more lithography and etching operations, a gate separation space 95 is formed as shown in FIG. 10. In some embodiments, the gate separation space 95 is formed between adjacent p-type fin structures 20P. In some embodiments, the gate separation space 95 passes through the isolation insulating layer 30 and penetrates the substrate 10. In some embodiments, two or more metal gate structures arranged in parallel with each other along the Y direction are cut or separated by the gate separation space 95.

Next, a first liner layer 102 is formed over the third hard mask layer 94 and in the gate separation space 95 as shown in FIG. 11. In some embodiments, the first liner layer 102 is made of silicon nitride or SiON formed by a suitable process such as ALD or CVD. The thickness of the first liner layer 102 is adjusted such that a space remains in the gate separation space after the first liner layer 102 is formed. In some embodiments, the thickness of the first liner layer 102 is in a range from about 5 nm to about 30 nm and is in a range from about 10 nm to about 20 nm in other embodiments.

Then, a sacrificial layer 104 is formed over the first liner layer 102 to fully fill the remaining space of the gate separation space as shown in FIG. 12. In some embodiments, the sacrificial layer 104 includes a carbon layer formed by a deposition method (e.g., CVD). In some embodiments, the carbon layer 104 is formed from plasma CVD using a hydrocarbon gas (e.g., $CH_4$, $C_2H_6$, etc.). In some embodiments, the carbon layer 104 is an amorphous carbon containing hydrogen or a diamond-like carbon. In some embodiments, the thickness of the sacrificial layer 104 is in a range from about 10 nm to about 30 nm to fully fill the opening 95.

In other embodiments, the sacrificial layer 104 includes a carbon containing layer or an organic material, such as polymer. In some embodiments, the sacrificial layer 104 is a photo resist, a bottom antireflective coating material, a top coating material or any other organic material used in the semiconductor manufacturing process.

Next, as shown in FIG. 13, the sacrificial layer 104 is recessed in the gate separation space by an etch-back operation. In some embodiments, the top of the remaining sacrificial layer 104 after the etch-back operation is higher than the top of the channel region. In other embodiments, the top of the remaining sacrificial layer 104 after the etch-back operation is lower than the top of the channel region. In some embodiments, the etch-back operation includes oxygen plasma treatment. In some embodiments, the sacrificial layer 104 is recessed so as to satisfy $0.3H1 \leq H2 \leq H1$, where H1 is a height of the metal gate electrode 86 from the upper surface of the isolation insulating layer 30, and H2 is a height of the remaining sacrificial layer 140 from the upper surface of the isolation insulating layer 30. In some embodiments, $0.5H1 \leq H2 \leq 0.8H1$. When the sacrificial layer 104 is recessed too much, a subsequently formed air gap is located too deep and thus may not sufficiently suppress parasitic capacitance between adjacent gate electrodes. When the recessed amount is too small, subsequently formed "cap" layers are located too high, and thus a planarization operation may open the air gap.

Then, as shown in FIG. 14, a second liner layer 106 as a first cap layer is formed over the first liner layer 102 and recessed sacrificial layer 104. In some embodiments, the second liner layer 106 is made of different material than the first liner layer and is made of silicon oxide or SiON formed by a suitable process such as ALD or CVD. The thickness of the second liner layer 106 is adjusted such that a space remains in the gate separation space after the second liner layer 106 is formed. In some embodiments, the thickness of the second liner layer 106 is in a range from about 1 nm to about 10 nm and is in a range from about 2 nm to about 5 nm in other embodiments.

Figure 15:
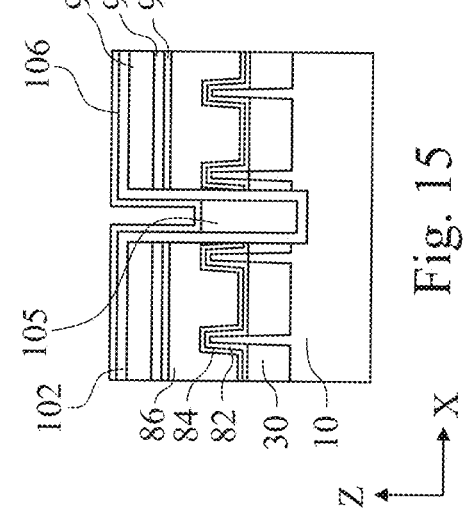

After the second liner layer 106 is formed, the sacrificial layer 104 is removed to form an air gap 105, as shown in FIG. 15. In some embodiments, ultraviolet (UV) radiation is applied in an oxygen ambient to convert the carbon of the sacrificial layer into a gas form, i.e., carbon dioxide gas. In some embodiments, the wavelength of the UV radiation is in a range from about 200 nm to about 450 nm (e.g., 248 nm, 356 nm or 435 nm). In other embodiments, a heating operation in an oxygen ambient is used to convert the carbon into carbon dioxide. In some embodiments, the temperature of the heat treatment is in a range from about 300° C. to about 550° C. The oxygen ambient includes ozone in some embodiments. In some embodiments, the UV treatment or the heating treatment is performed for a duration of about 1 min to about 20 min and in other embodiments for a duration of about 2 min to about 10 min. In some embodiments, the carbon dioxide concentration in the process chamber is monitored, and when the carbon dioxide concentration falls below a predetermined threshold or below the detection limit, the UV or heating operation is stopped. In some embodiments, the UV treatment and the heating treatment are performed at the same time. Since the second liner layer 106 is made of a thin silicon oxide film, the carbon dioxide gas passes through the second liner layer 106 and is exhausted to outside the enclosed space where the sacrificial layer 104 is disposed. In some embodiments, the second liner layer 106 is made of a porous material that allows gas to pass through.

In other embodiments, a plasma operation using an oxygen containing gas ($O_2$, $O_3$ etc.) is used to remove the sacrificial layer 104. In some embodiments, a wet cleaning using an organic solvent is used to remove the polymer based sacrificial layer 104. By removing the sacrificial layer 104 under the second liner layer 106, an air gap 105 is formed as shown in FIG. 15.

Figure 16:
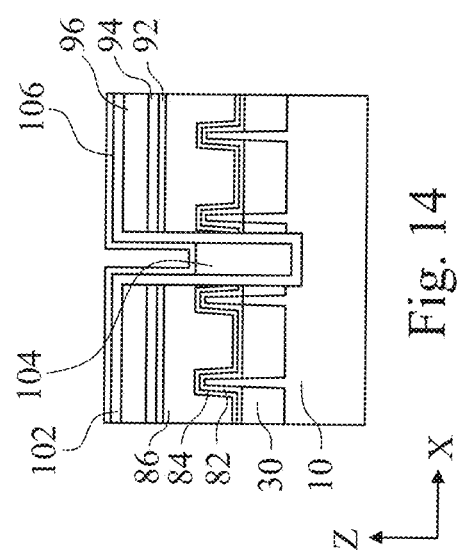

Further, as shown in FIG. 16, a third liner layer 108 as a second cap layer is formed over the second liner layer 104. In some embodiments, the third liner layer 108 is made of different material than the second liner layer and is made of silicon nitride or SiON formed by a suitable process, such as ALD or CVD. The thickness of the third liner layer 108 is adjusted such that a space, seam or slit 109 remains in the gate separation space after the third liner layer 108 is formed. In some embodiments, the thickness of the third liner layer 108 is in a range from about 5 nm to about 30 nm and is in a range from about 10 nm to about 20 nm in other embodiments. In other embodiments, the third liner layer fully fills the remaining space without leaving a seam or slit 109.

Figure 17:
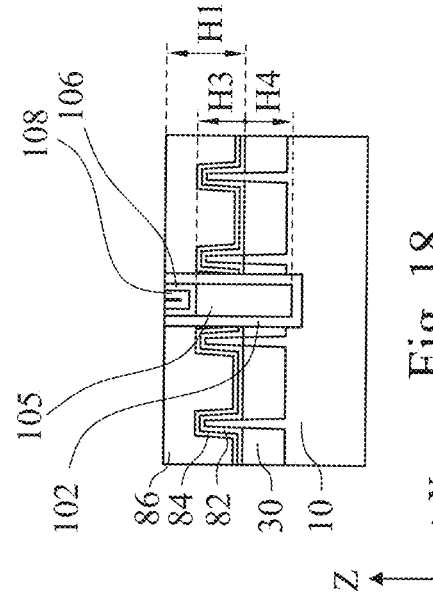
Figure 18:
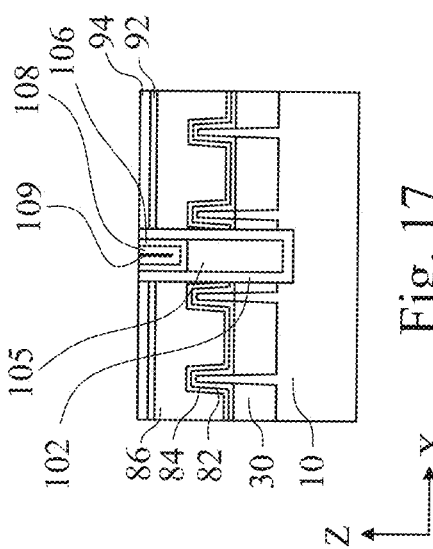

Then, as shown in FIG. 17, one or more planarization operations, such as CMP, are performed to remove parts of the third, second and first liner layers 102, 106, 108 and the third hard mask layer 96. In some embodiments, the CMP stops at the second hard mask layer 94 as shown in FIG. 17. Further, as shown in FIG. 18, the second hard mask layer 94 and the first hard mask layer 92 are also removed by the planarization operation, such as CMP, to expose the upper surface of the gate electrode layer 86. In some embodiments, after the gate electrode layer 86 is exposed, one or more dielectric layers are formed over the gate electrode layer.

In some embodiments, the dimensions of the air gap 105 satisfy $0.3H1 \leq H3 \leq H1$, where H1 is a height of the metal gate electrode 86 from the upper surface of the isolation insulating layer 30, and H3 is a height of the air gap 150 from the upper surface of the isolation insulating layer 30. In some embodiments, $0.5H1 \leq H3 \leq 0.8H1$. In some embodiments, a vertical center of the air gap 105 is located above the upper surface of the isolation insulating layer such that $H3>H4$, where H4 is a depth of the air gap from the bottom thereof to the upper surface of the isolation insulating layer 30. In other embodiments, $H3 \leq H4$. In some embodiments, a top of the air gap 105 is located above a top of the fin structure (channel region). In other embodiments, the top of the air gap 105 is located below the top of the fin structure (channel region). In some embodiments, the gate electrode structure (materials, etc.) of the gate electrodes separated by the air gap 105 are the same as each other. As shown in FIG. 18, one gate electrode covers two (or more) channel regions having different conductivity types in some embodiments.

FIGS. 19A-26 show various stages of a sequential manufacturing operation of a semiconductor device according to an embodiment of the present disclosure. It is understood that additional operations can be provided before, during, and after the operations of FIGS. 19A-26, and some of the operations described below can be replaced or eliminated, for additional embodiments of the method. The order of the operations/processes may be interchangeable. Materials, configurations, dimensions, processes, method and/or operations described with respect to FIGS. 1-18 may be employed in the following embodiments, and detailed description thereof may be omitted. In FIGS. 19A-24B, the "A" figures are perspective views and the "B" figures (and FIGS. 25 and 26) are cross sectional views along the X direction.

Figure 19B:
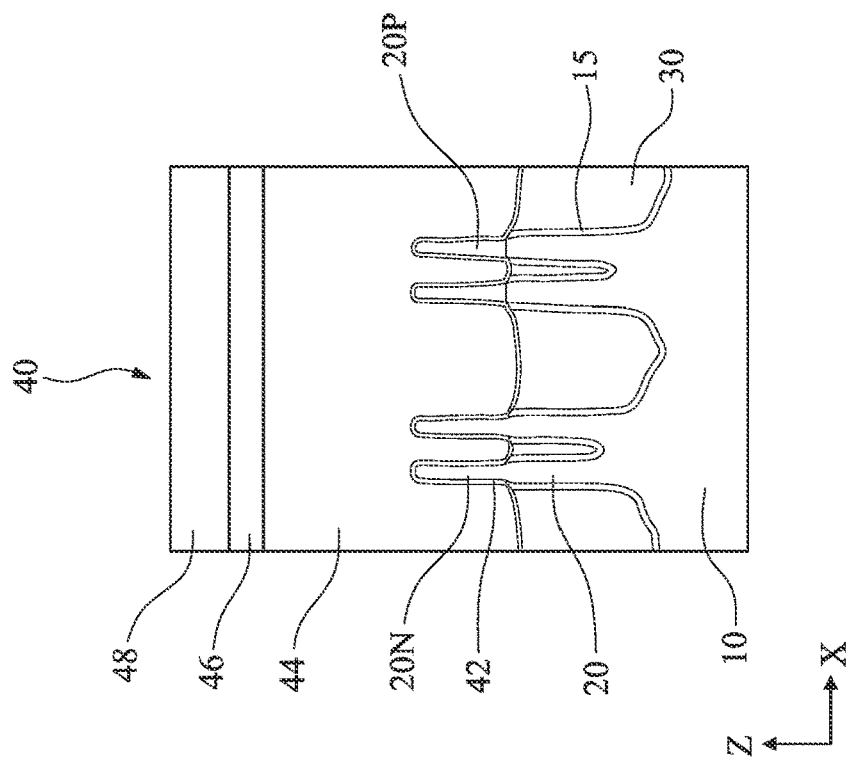
FIGS. 19A, 19B, 20A, 20B, 20C, 21A, 21B, 22A, 22B, 23A, 23B, 24A, 24B, 25 and 26 show various views of a sequential manufacturing process for a semiconductor device according to an embodiment of the present disclosure.
Figure 19A:
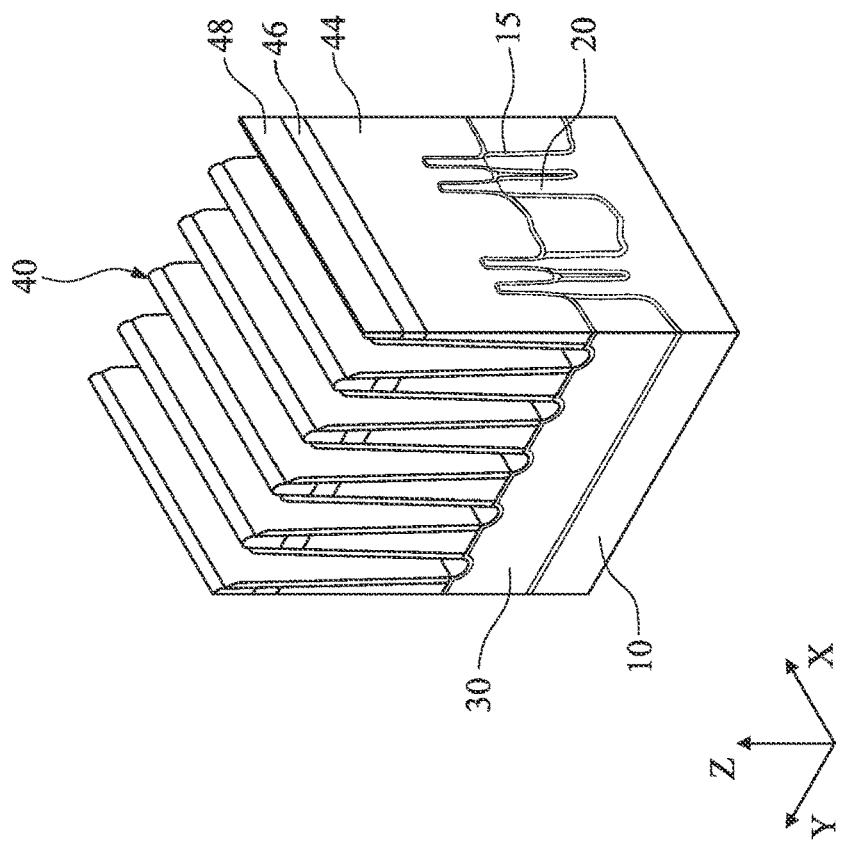

FIGS. 19A and 19B show the structure after dummy gate structures 40 with gate sidewall spacers 45 are formed over fin structures 20 disposed over a substrate 10. In some embodiments, the fin structures 20 includes a pair of n-type fin structures 20N for n-type FETs and a pair of p-type fin structures 20P for p-type FETs. In some embodiments, a fin liner layer 15 is formed over the fin structures 20 before forming the insulating material layer. The fin liner layer 15 includes one or more layers of silicon nitride, silicon oxide, SiON, SiOCN, aluminum oxide, AlOC, or any other suitable insulating material. The sacrificial gate electrode layer 44 is formed by patterning using the first hard mask layer 46 and the second hard mask layer 48 as an etching mask.

Figure 20B:
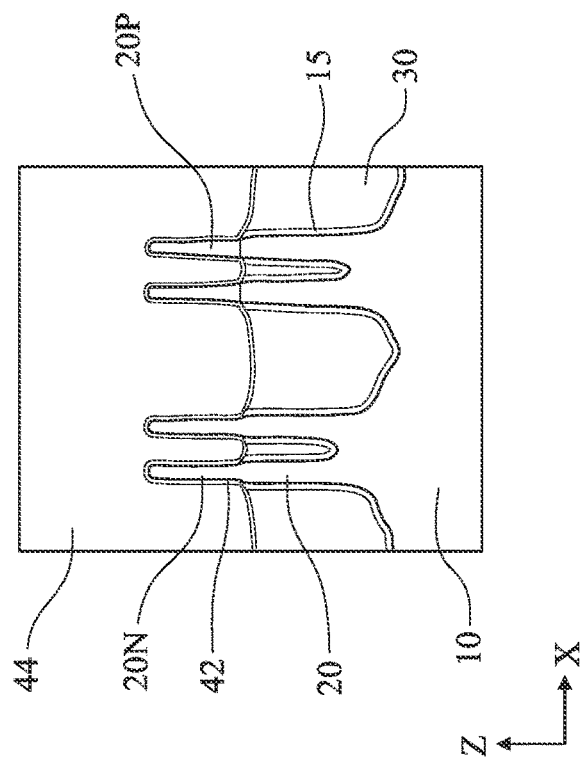
Figure 20A:
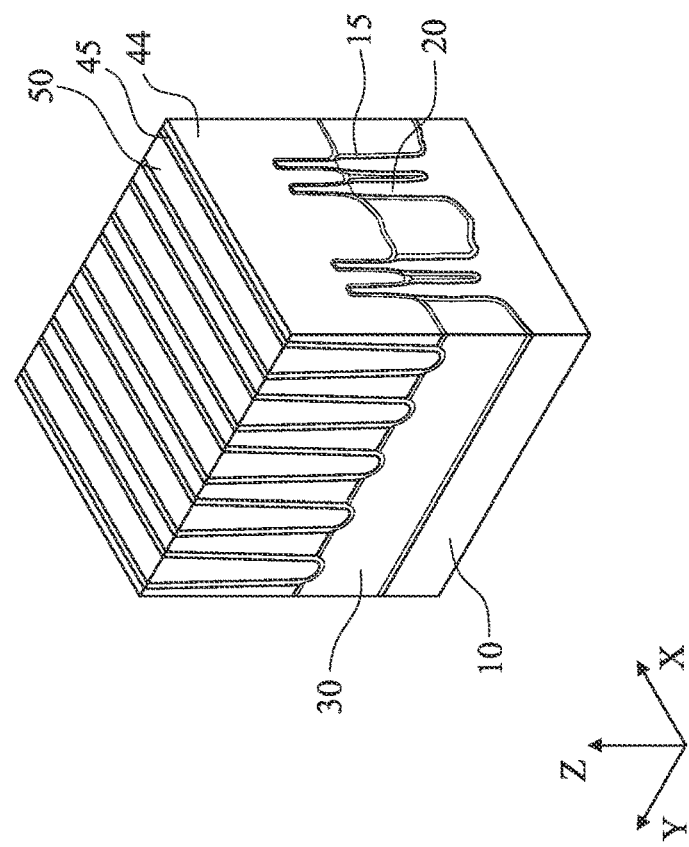
Figure 20C:
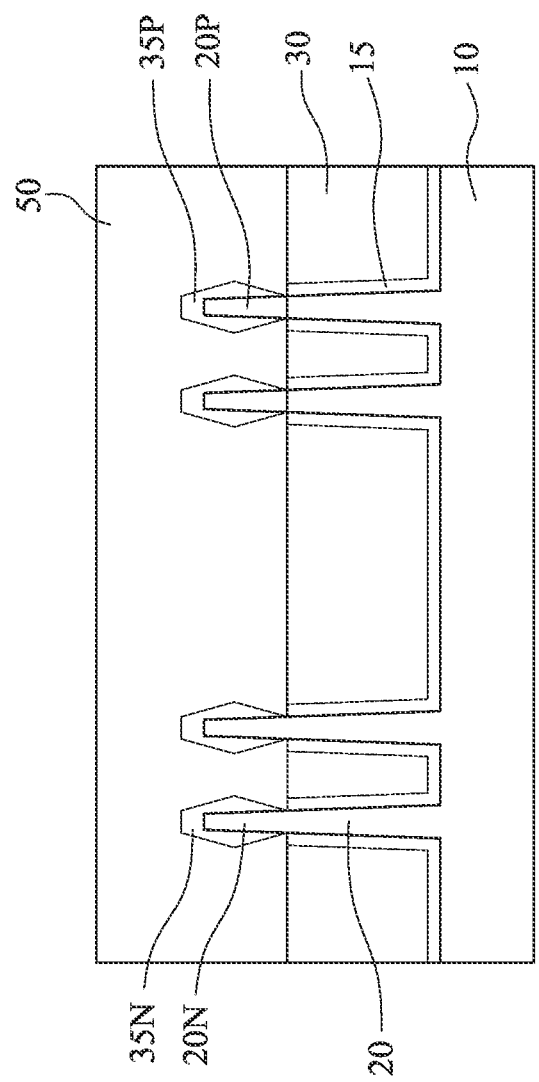

After the sacrificial gate structures 40 with the gate sidewall spacers 45 are formed, one or more source/drain epitaxial layers 35N and 35P are formed over source/drain regions of the fin structures, as shown in FIG. 20C. In some embodiments, the source/drain epitaxial layer 35N, 35P is individually formed over the fin structures 20N, 20P, respectively, without merging the adjacent source/drain epitaxial layer. In other embodiments, the adjacent source/drain epitaxial layers 35N (and/or 35P) are merged to form a merged epitaxial layer.

The materials used for the source/drain epitaxial layer may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form the epitaxial layer 35N, and SiGe or Ge may be used to form the epitaxial layer 35P. In some embodiments, boron (B) is doped in the source/drain epitaxial layer 35P for the p-type FinFETs. Other materials can be used. In some embodiments, the source/drain epitaxial layer includes two or more epitaxial layers with different compositions and/or different dopant concentrations. The source/drain epitaxial layer can be formed by CVD, ALD, molecular beam epitaxy (MBE), or any other suitable methods. In some embodiments, the source/drain regions of the fin structures 20 are recessed down below the upper surface of the isolation insulating layer 30, and then the epitaxial layer is formed on the recessed fin structures.

After the source/drain epitaxial layers 35N, 35P are formed, a first interlayer dielectric (ILD) layer 50 is formed as shown in FIGS. 20A-20C. In some embodiments, before forming the first ILD layer 50, an etch stop layer (ESL) is formed over the source/drain epitaxial layers and the gate sidewall spacers 45. The ESL is made of silicon nitride or a silicon nitride-based material (e.g., SiON, SiCN or SiOCN). The materials for the first ILD layer 50 include compounds comprising Si, O, C and/or H, such as silicon oxide, SiCOH and SiOC. Organic materials, such as polymers, may be used for the first ILD layer 50. In some embodiments, after the first ILD layer 50 is formed, a planarization operation, such as an etch-back process and/or a chemical mechanical polishing (CMP) process, is performed to expose the upper surface of the sacrificial gate electrode layers 44, as shown in FIGS. 20A and 20B.

Figure 21B:
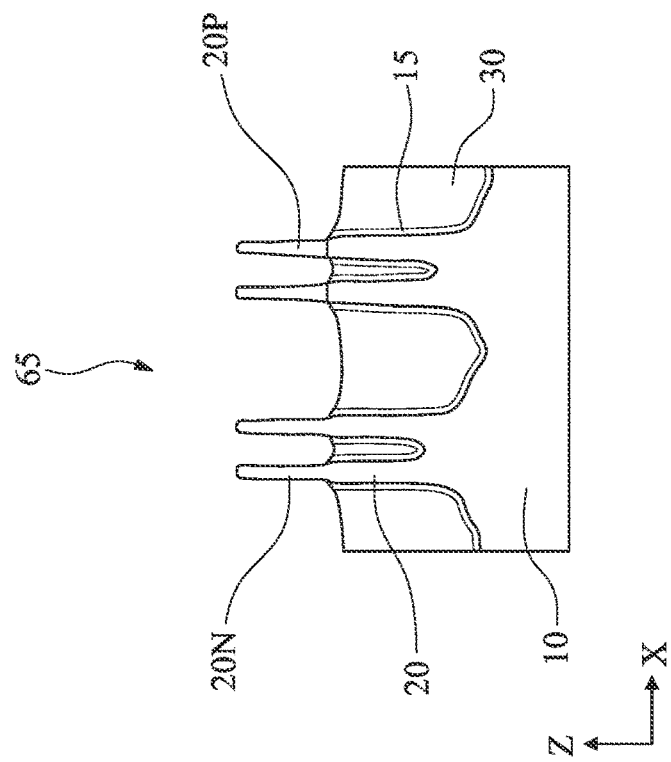
Figure 21A:
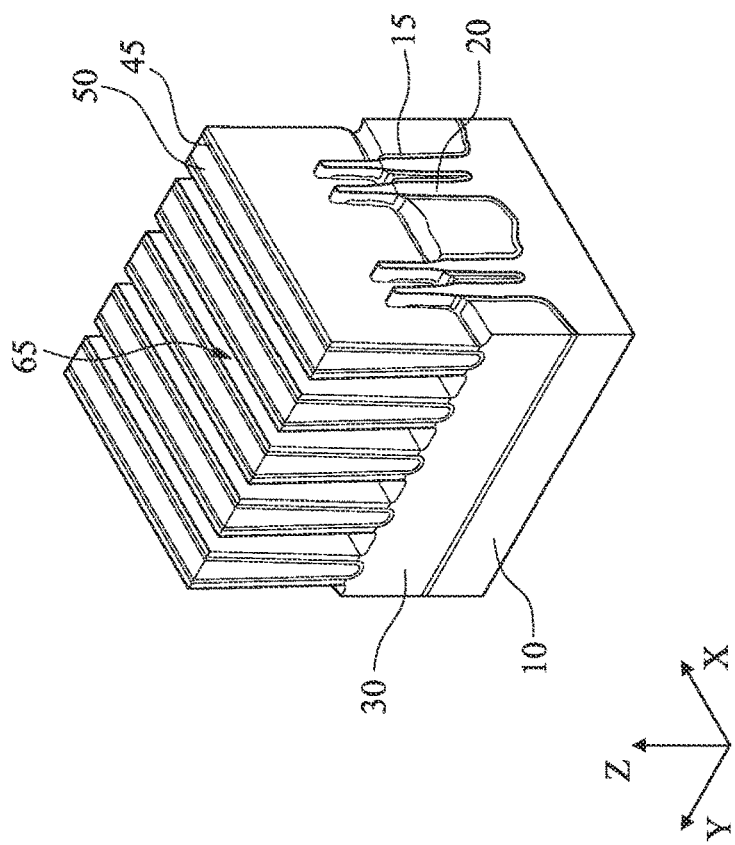

The sacrificial gate structures 40 are subsequently removed by one or more appropriate etching operations to form gate spaces 65, similar to the operations explained with respect to FIG. 5. As shown in FIGS. 21A and 21B, the upper portions of the fin structures 20N, 20P are exposed in the gate spaces 65.

Figure 22B:
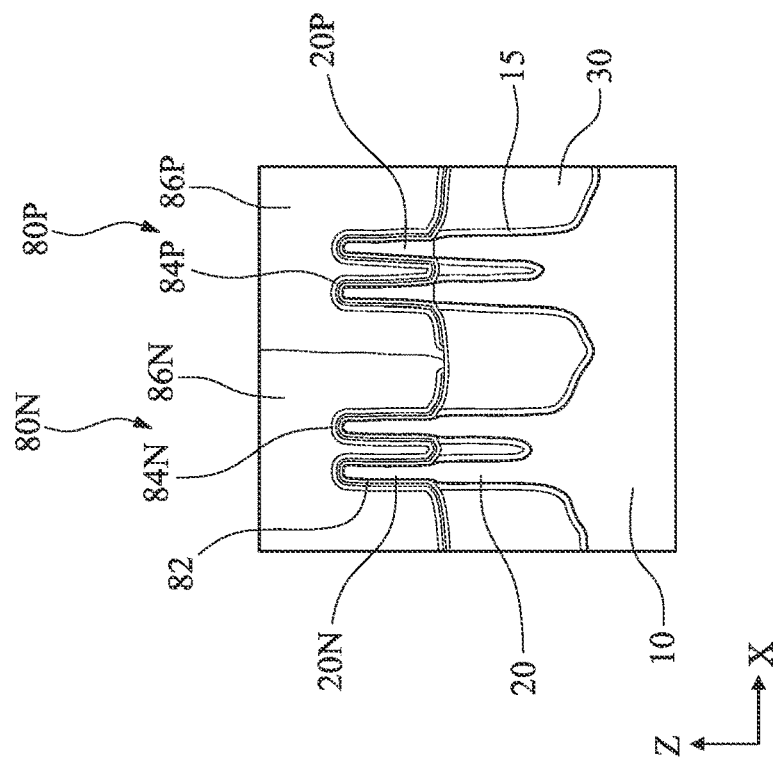
Figure 22A:
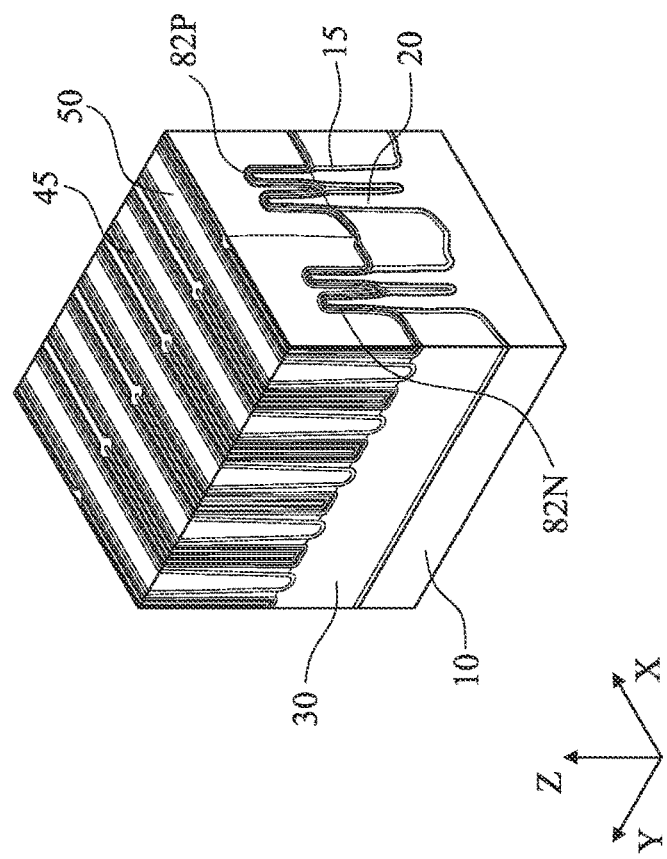
Figure 23B:
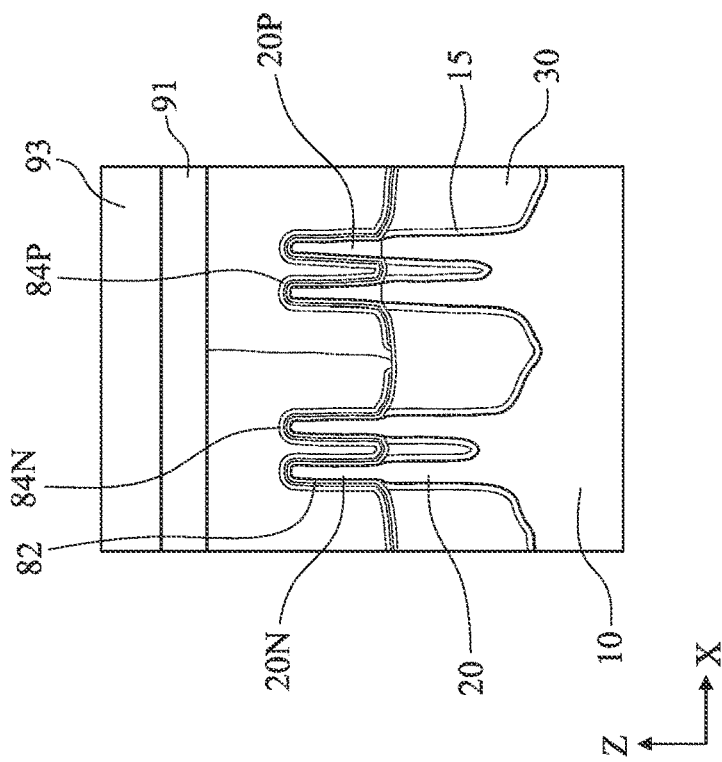
Figure 23A:
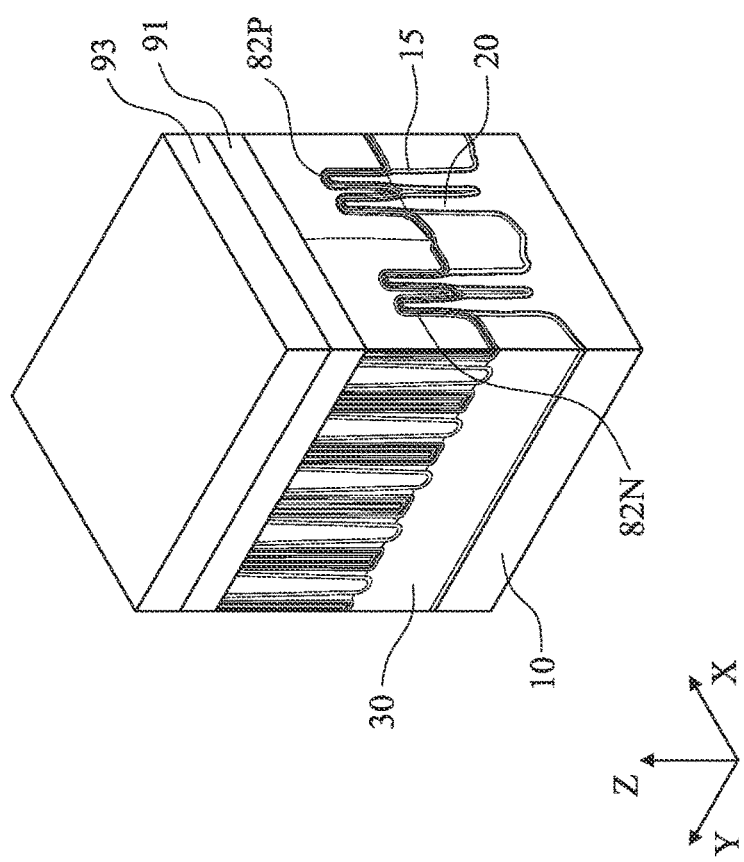

Similar to the operations explained with respect to FIGS. 6-8, after the upper portion of the fin structures 20 are exposed, in the gate space 65, a gate dielectric layer including an interfacial layer and a high-k gate dielectric layer 82 are formed on the exposed fin structures (channel layers) 20N, 20P. Further, one or more work function adjustment layers 84N, 84P are formed over the gate dielectric layer 82, and a main metal layer 86N, 86P is formed over the work function adjustment layers, as shown in FIGS. 22A and 22B.

In some embodiments, the n-type work function adjustment layer 84N for an n-type FET includes one or more of TaN, TaAlC, TiN, TiC, Co, TiAl, HfTi, TiSi and TaSi. In some embodiments, the p-type work function adjustment layer 84P for a p-type FET includes one or more of TiAlC, Al, TiAl, TaN, TaAlC, TiN, TiC and Co. In some embodiments, one or more layers of the n-type work function adjustment layer are also formed over the p-type channel region 20P, and no p-type work function adjustment layer is formed over the n-type channel region 20N. In other embodiments, one or more layers of the p-type work function adjustment layer are also formed over the n-type channel region 20N, and no n-type work function adjustment layer is formed over the p-type channel region 20P.

Then, one or more hard mask layers are formed over the gate electrodes 80N, 80P and the first ILD layer 50. In some embodiments, the hard mask layer includes a first hard mask layer 91 and a second hard mask layer 93 made of different materials from each other. In some embodiments, the first hard mask layer 91 is made of silicon oxide and the second hard mask layer 93 is made of silicon nitride or SiON.

Figure 24B:
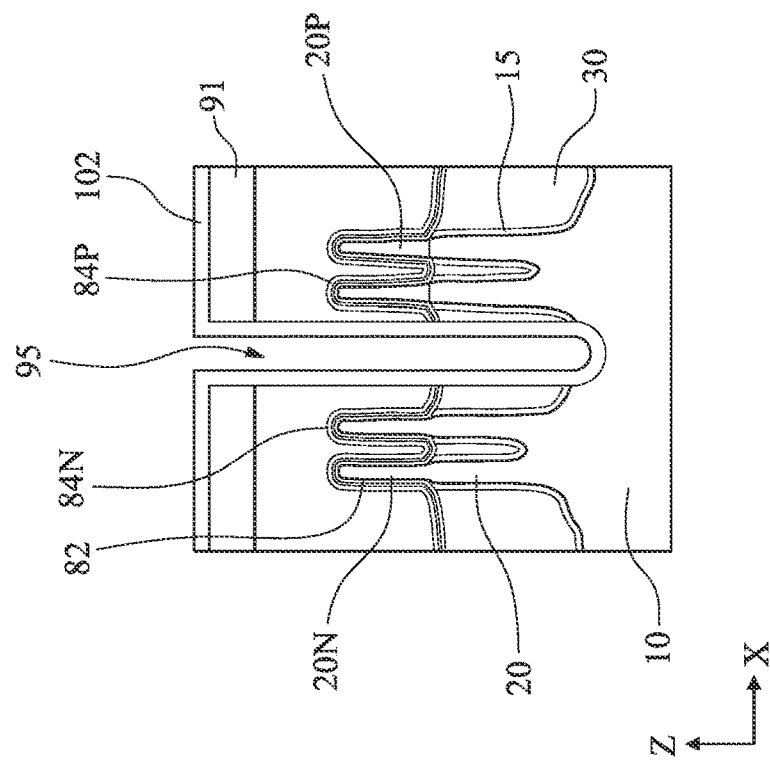
Figure 24A:
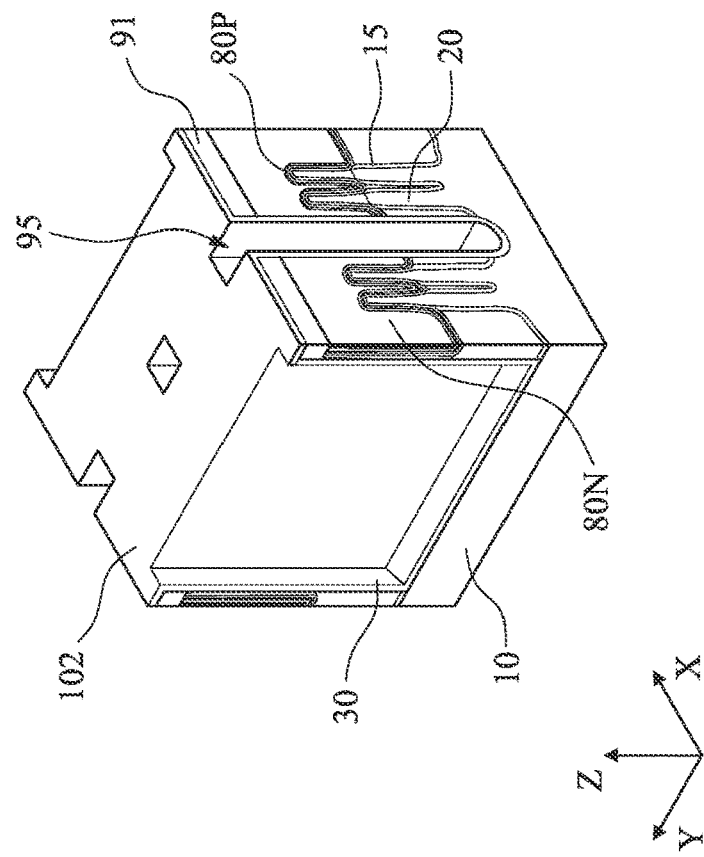

The metal gate structures extending in the X direction are cut into a plurality pieces of metal gate structures by an end cut process. The end cut process includes one or more lithography and etching operations. By the end cut process, one or more gate end spaces 95 are formed as shown in FIGS. 24A and 24B. In some embodiments, the gate end spaces 95 extend into the isolation insulating layer 30. In some embodiments, the gate end spaces 95 reaches the fin liner layer 15. In some embodiments, the fin liner layer 15 remains in the bottom of the gate end space 95. In other embodiments, the fin liner layer 15 is fully removed from the gate end space 95. In other embodiments, part of the isolation insulating layer 30 remains at the bottom of the gate end space 95. In some embodiments, the gate space 95 cuts the interface between the p-type gate electrode and the n-type gate electrode.

In some embodiments, a photo resist layer having openings therein is formed over the hard mask layers. In some embodiments, at least one opening is located over two or more metal gate electrode layers. By using the photo resist layer as an etching mask, the second hard mask layer 93 is patterned and then the first hard mask layer 91 is patterned. After the second hard mask layer 93 is removed, the metal gate electrode layers are patterned by using the patterned first hard mask layer 91.

Further, similar to the operation explained with respect to FIG. 11, the first liner layer 102 is formed as shown in FIGS. 24A and 24B.

Figure 25:
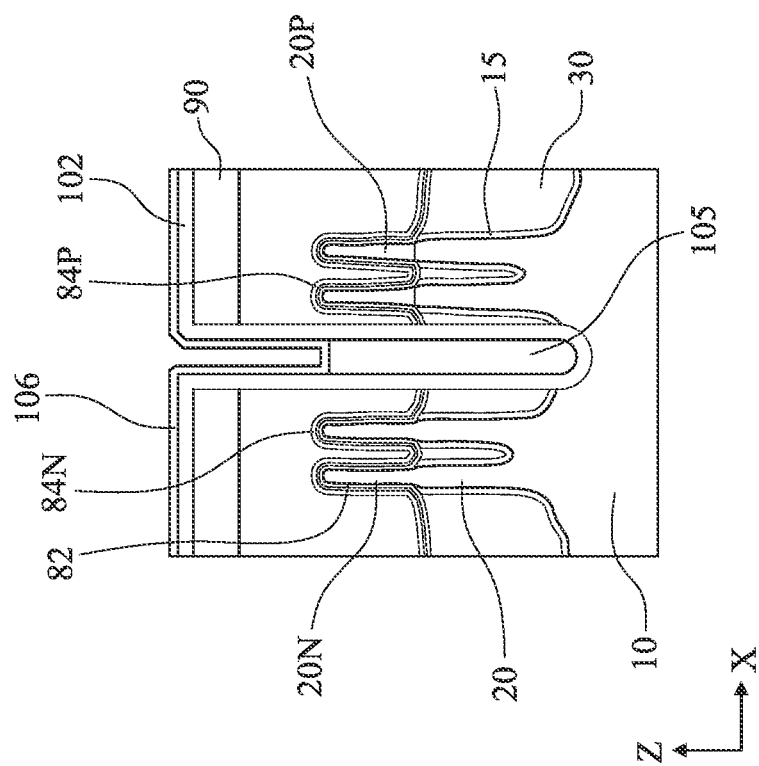

Then, similar to the operations explained with respect to FIGS. 12-15, the air gap 105 is formed between the p-type gate electrode (p-type FET) and the n-type gate electrode (n-type FET) as shown in FIG. 25.

Figure 26:
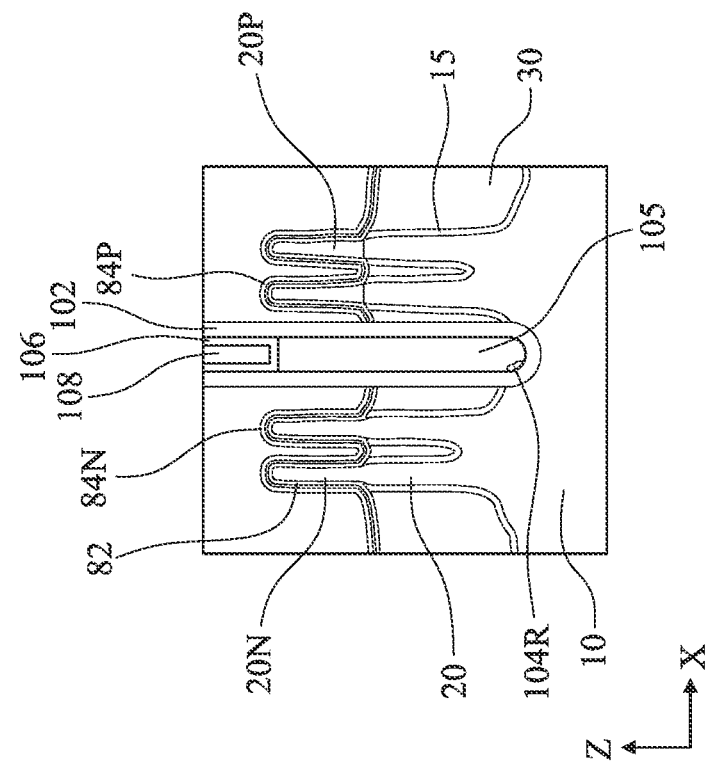

Further, similar to the operations explained with respect to FIGS. 16-18, the gate electrode layers are exposed as shown in FIG. 26. In some embodiments, a semiconductor device includes a first gate electrode for a first Fin FET separated by a separation structure including an air gap from a second gate electrode for a second FinFET. As shown in FIG. 26, the air gap 105 is enclosed by the first liner layer 102 and the second liner layer 106 made of a different material from the first liner layer 102. The second liner layer 106 covers or defines the top of the air gap 105. Further, as shown in FIG. 26, the second liner layer 106 has a U-shape trench (U-shape cross section) having sides and a curved bottom and the sides are in contact with the first liner layer 102. The third liner layer 108 fully or partially fills the U-shape trench of the second liner layer 106. In some embodiments, when the sacrificial layer 104 is not completely removed, a carbon containing layer (carbon residue) 104R is disposed inside the air gap 105.

FIGS. 27-38 are schematic illustrations of a sequential step of manufacturing a semiconductor device according to an embodiment of the present disclosure. It is understood that additional operations can be provided before, during, and after the operations of FIGS. 27-38, and some of the operations described below can be replaced or eliminated, for additional embodiments of the method. The order of the operations/processes may be interchangeable. Materials, configurations, dimensions, processes, methods and/or operations described with respect to FIGS. 1-26 may be employed in the following embodiments, and detailed description thereof may be omitted.

Figure 27:
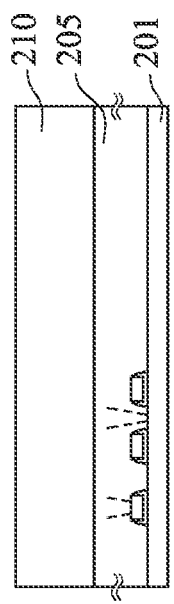

As shown in FIG. 27, a first interlayer dielectric (ILD) layer 210 is formed over the underlying structures 205 disposed over the substrate 201. An interlayer dielectric layer may also be called an inter-metal dielectric (IMD) layer. The first ILD layer 210 is made of, for example, one or more layers of a low-k dielectric material. Low-k dielectric materials have a k-value (dielectric constant) lower than about 4.0. Some low-k dielectric materials have a k-value lower than about 3.5 and may have a k-value lower than about 2.5.

The materials for the first ILD layer 210 include compounds formed of elements of Si, O, C and/or H, such as SiCOH and SiOC. Organic materials, such as polymers, may be used for the first ILD layer 210. For example, the first ILD layer 210 is made of one or more layers of a carbon-containing material, organo-silicate glass, a porogen-containing material, and/or combinations thereof in some embodiments. Nitrogen may also be included in the first ILD layer 210. The first ILD layer 210 may be a porous layer. The density of the first ILD layer 210 is less than about 3 g/cm³ in one embodiment and less than about 2.5 g/cm³ in other embodiments. The first ILD layer 210 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr. In some embodiments, the first ILD layer may include an inter-layer insulating film and an inter-wire insulating film such that the metal wirings will be formed mainly in the inter-metal insulating film. The inter-layer insulating film may include a SiOC film and the inter-wire insulating film may include a TEOS (tetraethyl-orthosilicate) film.

Figure 28:
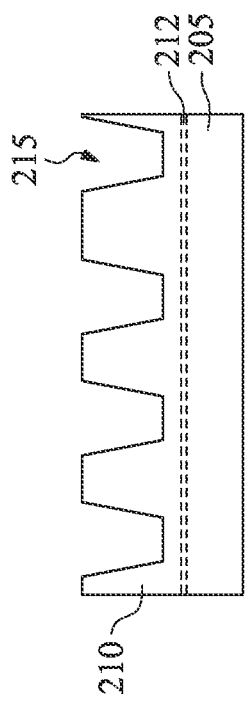

As shown in FIG. 28, first recesses 215 are formed in the first ILD layer 210 by using patterning operations including lithography and etching processes. In some embodiments, one or more via holes (contact holes) (not shown) to be connected to one or more elements of the underlying structures are formed at the bottom of the first recesses. In some embodiments, a first etch-stop layer 212 is formed between the underlying structure 205 and the first ILD layer 210. The depth of the recesses 215 may be controlled by controlling an etching time or an etching rate of the recess etching.

Figure 29:
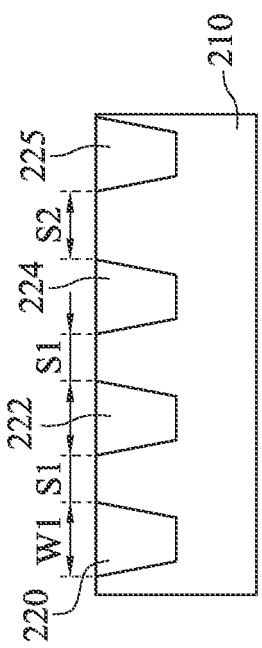

As shown in FIG. 29, a metal material is formed in the first recesses to form metal wirings 220, 222, 224 and 225. The operations to form the metal wirings include a damascene process. In the damascene process, one or more layers of metal material are formed in the first recesses 215 and the upper surface of the first ILD layer 210, and a planarization operation such as a chemical mechanical polishing method and/or a etch-back method is performed to remove portions of the metal material formed on the upper surface of the first ILD layer 210. As shown in FIG. 29, in some embodiments, the metal wirings 220, 222 and 224 are arranged with a space S1 in between, and the metal wirings 224 and 225 are arranged with a space S2 in between, where S2>S1.

The one or more layers of metal material for the metal wirings 220, 222, 224 and 225 are formed by CVD, physical vapor deposition (PVD) and/or electro-plating. The metal material for the metal wirings is one or more layers of Al, Cu, Co, Mn, W, Ti, Ta, TiN, TaN, TiW, WN, TiAl, TiAlN, TaC, TaCN and TiSiN. For example, the metal wirings may include a barrier layer made of, for example, TiN and/or TaN, and a body layer made of, for example, Cu or Cu-based materials. The metal wiring structure may be made by a damascene process.

Figure 30:
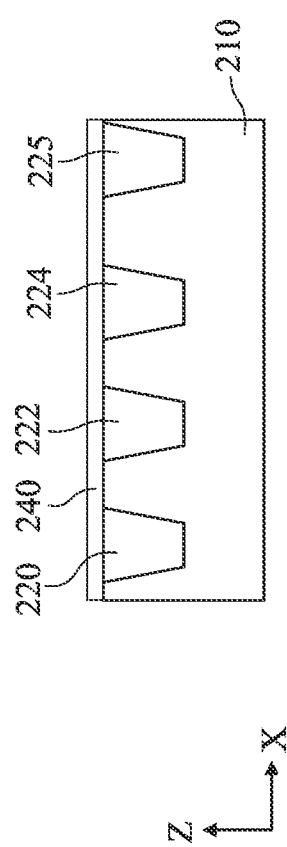

After forming the metal wirings 220, 222, 224 and 225, a second etch-stop layer 240 is formed over the metal wirings, as shown in FIG. 30. The second etch-stop layer 240 functions as an etching mask layer in a subsequent etching of the first ILD layer 210. The second etch-stop layer 240 includes one or more layers of a Si-based insulating material containing Si with O, N, C, B and or H, or an Al-based insulating material containing Al with O, N, C, B and or H. Examples of the second etch-stop layer include SiN, SiCO, SiCN, and SiCON.

The thickness of the second etch-stop layer 240 is in a range of about 1 nm to about 40 nm in some embodiments, and is in a range of about 5 nm to about 20 nm in other embodiments. The density of the second etch-stop layer 240 is less than about 3 g/cm³ in one embodiment and is less than about 2.5 g/cm³ in other embodiments. The second etch-stop layer 240 may be formed by using, for example, PECVD, LPCVD, ALCVD, and/or a spin-on technology. In case of PECVD, the second etch-stop layer 240 is deposited at a substrate temperature in a range of about 25° C. to about 400° C. and at a pressure of less than 100 Torr.

Figure 31:
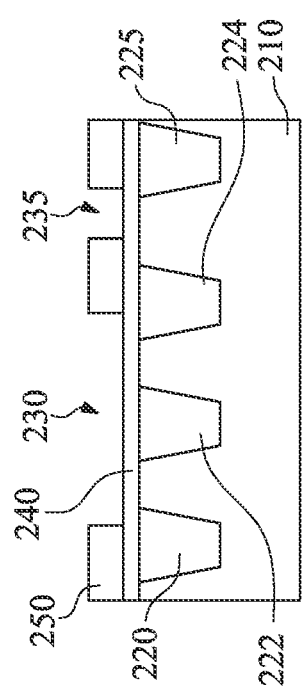
Figure 32:
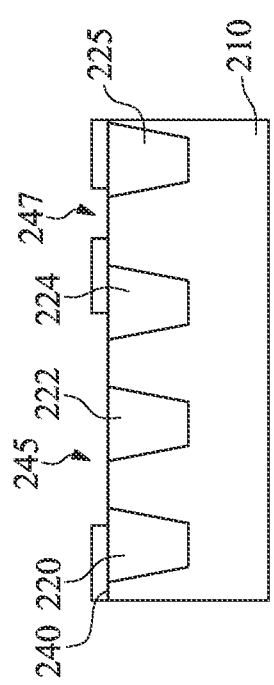

After the formation of the second etch-stop layer 240, second recesses 225A, 225B and 225C are formed in the first ILD layer 210 between the first wiring 220 and the second wiring 222, between the second wiring 222 and the third wiring 224, and between the third wiring 224 and the fourth wiring 225, as shown in FIGS. 31-33.

The second recesses 225A-225C are formed in the first ILD layer 210 by using patterning operations including lithography and etching processes. As shown in FIG. 31, a mask layer 250, for example, a resist mask or a hard mask, is formed on the second etch-stop layer 240, and openings 230 and 235 are formed by a lithography process. In one embodiment, the first opening 230 overlaps at least two metal wirings in plan view. In some embodiments, the first opening 30 overlaps more than three metal wirings.

Then, by using dry etching and/or wet etching, the second etch-stop layer 240 is patterned to make openings 245 and 247, as shown in FIG. 32. The first ILD layer 210 under the openings 245 and 247 is subsequently etched to form the second recesses 225A-225C, as shown in FIG. 33. Since this etching mainly etches the first ILD layer 210, and the metal material for the wiring layers is not substantially etched, the second recesses 225A and 225B are formed self-aligned besides the second wirings 220, 222 and 224. The depth of the second recesses may be at the same level as the bottoms of the metal wirings or may be deeper than the bottoms of the metal wirings. The dry etching to form the second recesses 225A and 225B utilizes gases containing fluorine (F) and/or chlorine (Cl) in some embodiments. After the dry etching, a wet cleaning operation followed by a baking operation is performed, in some embodiments. As shown in FIG. 33, an upper opening portion of the second recesses 225A or 225B is defined by the adjacent two metal wirings 220 and 222 or 222 and 224, respectively. An upper opening portion of the second recess 225C is defined by one of the adjacent two metal wirings (224 or 225), and the second etch-stop layer 240.

Then, similar to the operation explained with respect to FIG. 11, a first liner layer 102A consistent with the first liner layer 102 is formed as shown in FIG. 34.

Then, similar to the operations explained with respect to FIGS. 12-13, a sacrificial layer 104A consistent with the sacrificial layer 104 is formed in the second recesses 225A, 225B and 225C.

Figure 36:
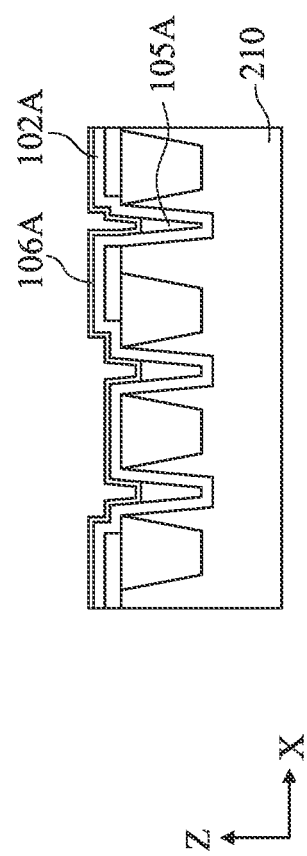

Further, similar to the operations explained with respect to FIGS. 14 and 15, a second liner layer 106A consistent with the second liner layer 106 is formed and an air gap 105A consistent with the air gap 105 is formed between the adjacent wiring patterns as shown in FIG. 36.

Figure 37:
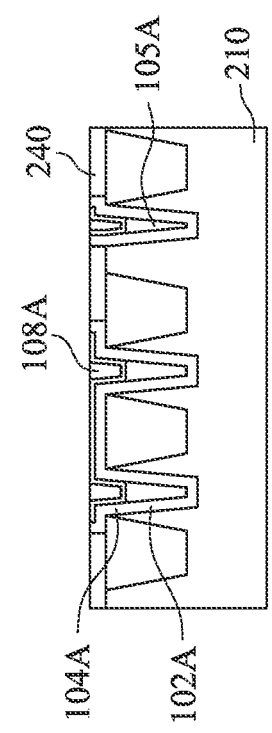
Figure 38:
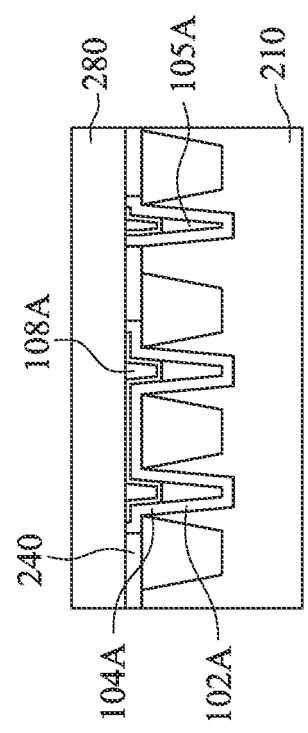

Further, similar to the operations explained with respect to FIGS. 16-18, a third liner layer 108A consistent with the third liner layer 108 is formed and one or more planarization operations are performed. In some embodiments, the planarization operation exposes the second etch stop layer 240, as shown in FIG. 37. Further, in some embodiments, a third ILD layer 260 is formed as shown in FIG. 38.

In the present disclosure, an air gap is formed as a part of a gate separation structure or a between metal wiring patterns, and thus it is possible to suppress parasitic capacitance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a metal gate structure is formed and cut into two pieces of metal gate structures by forming a gate end spaces. A first liner layer is formed in the gate end space, and a sacrificial layer is formed on the first liner layer, and recessed. A second liner layer is formed over the recessed sacrificial layer, an air gap is formed by removing the recessed sacrificial layer; and a third liner layer is formed over the second liner layer. In one or more of the foregoing and the following embodiments, the sacrificial layer comprises a carbon containing layer. In one or more of the foregoing and the following embodiments, the sacrificial layer comprises a carbon layer formed by deposition method. In one or more of the foregoing and the following embodiments, the recessed sacrificial layer is removed by converting the recessed sacrificial layer into a gas form so that the gas passes through the second liner layer. In one or more of the foregoing and the following embodiments, the recessed sacrificial layer is converted into the gas form by applying ultraviolet light in an oxygen ambient. In one or more of the foregoing and the following embodiments, the recessed sacrificial layer is converted into the gas form by applying heat in an oxygen ambient. In one or more of the foregoing and the following embodiments, the second liner layer is made of silicon oxide. In one or more of the foregoing and the following embodiments, the first liner layer and the third liner layer are made of one of silicon nitride, SiON, SiOCN or SiCN.

In accordance with another aspect of the present disclosure, in a method of manufacturing a semiconductor device, a plurality of fin structures are formed over a semiconductor substrate. The plurality of fin structures extend along a first direction and are arranged in a second direction crossing the first direction. A plurality of sacrificial gate structures extending in the second direction are formed over the fin structures, an interlayer dielectric layer is formed over the plurality of fin structures between adjacent sacrificial gate structures, the plurality of sacrificial gate structures are removed to form gate spaces, metal gate structures are formed in the gate spaces, the metal gate structures are cut into a plurality of pieces of metal gate structures by forming gate end spaces along the second direction, a first liner layer is formed in the gate end spaces, a sacrificial layer is formed on the first liner layer, the sacrificial layer is recessed, a second liner layer is formed over the recessed sacrificial layer, an air gap is formed by removing the recessed sacrificial layer in each of the gate end spaces, and a third liner layer is formed over the second liner layer. In one or more of the foregoing and the following embodiments, the sacrificial layer comprises a amorphous carbon layer. In one or more of the foregoing and the following embodiments, the amorphous carbon layer is formed by deposition method from hydrocarbon. In one or more of the foregoing and the following embodiments, the recessed sacrificial layer is removed by converting the recessed sacrificial layer into carbon dioxide. In one or more of the foregoing and the following embodiments, the recessed sacrificial layer is converted into the carbon dioxide by applying ultraviolet light in an oxygen ambient. In one or more of the foregoing and the following embodiments, the recessed sacrificial layer is converted into the carbon dioxide form by applying heat in an oxygen ambient. In one or more of the foregoing and the following embodiments, the second liner layer is made of silicon oxide, and the first liner layer and the third liner layer are made of silicon nitride.

In accordance with another aspect of the present disclosure, in a method of manufacturing a semiconductor device, a space between conductive patterns is formed, a first liner layer is formed in the space, a sacrificial layer is formed on the first liner layer, the sacrificial layer is recessed, a second liner layer is formed over the recessed sacrificial layer, an air gap is formed by removing the recessed sacrificial layer, and a third liner layer is formed over the second liner layer. In one or more of the foregoing and the following embodiments, the conductive patterns are metal wiring patterns made of Cu or a Cu alloy. In one or more of the foregoing and the following embodiments, the conductive patterns are a first conductive pattern and a second conductive pattern including a different conductive material than the first conductive pattern. In one or more of the foregoing and the following embodiments, the sacrificial layer is a carbon layer. In one or more of the foregoing and the following embodiments, the sacrificial layer is an organic material layer.

In accordance with another aspect of the present disclosure, a semiconductor device includes a first fin field-effect transistor (Fin FET) and a second FinFET. The first FinFET includes a first fin structure extending in a first direction and a first gate structure. The first gate structure includes a first gate dielectric layer formed over the first fin structure and a first gate electrode layer formed over the first gate dielectric layer and extends in a second direction perpendicular to the first direction. The second Fin FET includes a second fin structure extending in the first direction and a second gate structure. The second gate structure includes a second gate dielectric layer formed over the second fin structure and a second gate electrode layer formed over the second gate dielectric layer, and extends in the second direction. The semiconductor device further includes sidewall spacers extending in the second direction, between which the first and second gate structures are disposed. The first gate structure and the second gate structure are aligned along the second direction and are separated by a separation structure, and the separation structure includes an air gap. In one or more of the foregoing and the following embodiments, the air gap is enclosed by a first liner layer and a second liner layer made of a different material from the first liner layer. In one or more of the foregoing and the following embodiments, the second liner layer covers the top of the air gap. In one or more of the foregoing and the following embodiments, the second liner layer is made of silicon oxide. In one or more of the foregoing and the following embodiments, the first liner layer is made of silicon nitride. In one or more of the foregoing and the following embodiments, the second liner layer has a U-shape trench having sides and a bottom and the sides are in contact with the first liner layer. In one or more of the foregoing and the following embodiments, a third liner layer made of a different material than the second liner layer is disposed in the U-shape trench. In one or more of the foregoing and the following embodiments, the third liner layer is made of silicon nitride. In one or more of the foregoing and the following embodiments, a carbon containing layer is disposed inside the air gap.

In accordance with another aspect of the present disclosure, a semiconductor device includes an isolation insulating layer disposed over a substrate, a first gate structure disposed over one or more fin structures protruding, wherein the first gate structure includes a first gate dielectric layer and a first gate electrode layer formed over the first gate dielectric layer and extending in a first direction, a second gate structure disposed over one or more fin structures, wherein the second gate structure includes a second gate dielectric layer and a second gate electrode layer formed over the second gate dielectric layer and extending in the first direction, and sidewall spacers extending in the second direction, between which the first and second gate structures are disposed. The one or more fin structures of the first and second gate structures have upper portions protruding from the isolation insulating layer and lower portions embedded in the isolation insulating layer, the first gate structure and the second gate structure are aligned along the second direction and are separated by a separation structure, and the separation structure includes an air gap that penetrates the isolation insulating layer. In one or more of the foregoing and the following embodiments, the air gap is enclosed by a first liner layer and a second liner layer made of a different material from the first liner layer, and the first liner layer reaches the substrate. In one or more of the foregoing and the following embodiments, a fin liner layer is disposed on the lower portions of the one or more fin structures, and the first liner layer is in contact with the fin liner layer. In one or more of the foregoing and the following embodiments, the second liner layer covers the top of the air gap and has a U-shape trench, and a third liner layer made of a different material than the second liner layer is disposed in the U-shape trench. In one or more of the foregoing and the following embodiments, the first gate electrode layer and the second gate electrode layer are in contact with the first liner layer. In one or more of the foregoing and the following embodiments, the second liner layer is made of silicon oxide. In one or more of the foregoing and the following embodiments, the first and third liner layer is one of silicon nitride, SiON, SiOCN or SiCN. In one or more of the foregoing and the following embodiments, the first gate electrode layer comprises a at least one conductive layer which is not included in the second gate electrode layer.

In accordance with another aspect of the present disclosure, a semiconductor device includes an isolation insulating layer disposed over a substrate, a first fin structure for an n-type FET and a second fin structure for a p-type FET, wherein the first and second fin structures extend along a first direction and arranged in a second direction crossing the first direction, a first metal gate structure extending in the second direction over the first fin structure and a second metal gate structure extending in the second direction over the second fin structure, and disposed adjacent to the first metal gate structure in the second direction, gate sidewall spacers continuously disposed on opposing side faces of the first and second metal gate structures, a first epitaxial layer disposed over a source/drain region of the first fin structure and a second epitaxial layer disposed over a source/drain region of the second fin structure, an interlayer dielectric layer over the first and second epitaxial layers, and a gate separation structure disposed between the first and second gate structures. The separation structure includes an air gap, and a vertical length of an upper portion of the air gap above an upper surface of the isolation insulating layer is greater than a vertical length of a lower portion of the air gap below the upper surface of the isolation insulating layer. In one or more of the foregoing and the following embodiments, the air gap is enclosed by a first liner layer contacting the air gap and a second liner layer made of a different material from the first liner layer and capping the air gap, and a third liner layer is disposed over the second air gap. In one or more of the foregoing and the following embodiments, a top of the first liner layer, a top of the second liner layer and a top of the third liner layer are flush with each other.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a metal gate structure;
    cutting the metal gate structure into two pieces of gate structures by forming a gate end space;
    forming a first liner layer in the gate end space;
    forming a sacrificial layer on the first liner layer;
    recessing the sacrificial layer;
    forming a second liner layer over the recessed sacrificial layer;
    forming an air gap by removing the recessed sacrificial layer; and
    forming a third liner layer over the second liner layer, at least a portion of the third liner layer being between the two pieces of gate structures within the gate end space,
    wherein the third liner layer is made of at least one of silicon nitride, SiON, SiOCN, or SiCN.

2. The method of claim 1, wherein the sacrificial layer comprises a carbon containing layer.

3. The method of claim 2, wherein the carbon containing layer is formed by deposition method.

4. The method of claim 2, wherein the recessed sacrificial layer is removed by converting the recessed sacrificial layer into a gas form so that the gas passes through the second liner layer.

5. The method of claim 4, wherein the recessed sacrificial layer is converted into the gas form by applying ultraviolet light in an oxygen ambient.

6. The method of claim 4, wherein the recessed sacrificial layer is converted into the gas form by applying heat in an oxygen ambient.

7. The method of claim 4, wherein the second liner layer is made of silicon oxide.

8. The method of claim 1, wherein the first liner layer is made of at least one of silicon nitride, SiON, SiOCN, or SiCN.

9. The method of claim 1, wherein
    the forming the metal gate structure comprises forming the metal gate structure over an insulating layer that is over a semiconductor substrate, and
    the forming the gate end space comprises forming the gate end space that extends through the insulating layer and into the semiconductor substrate.

10. A method of manufacturing a semiconductor device, comprising:
    forming a plurality of fin structures over a semiconductor substrate, the plurality of fin structures extending along a first direction and arranged in a second direction crossing the first direction;
    forming a plurality of sacrificial gate structures extending in the second direction over the fin structures;

forming an interlayer dielectric layer over the plurality of fin structures between adjacent sacrificial gate structures;
removing the plurality of sacrificial gate structures to form gate spaces;
forming metal gate structures in the gate spaces;
cutting the metal gate structures into a plurality of pieces of gate structures by forming gate end spaces along the second direction;
forming a first liner layer in the gate end spaces;
forming a sacrificial layer on the first liner layer;
recessing the sacrificial layer;
forming a second liner layer over the recessed sacrificial layer;
forming an air gap by removing the recessed sacrificial layer in each of the gate end spaces; and
forming a third liner layer over the second liner layer, at least a portion of the third liner layer being between adjacent ones of the plurality of pieces of gate structures within the gate end spaces,
wherein the third liner layer is made of at least one of silicon nitride, SiON, SiOCN, or SiCN.

11. The method of claim 10, wherein the sacrificial layer comprises an amorphous carbon layer.

12. The method of claim 11, wherein the amorphous carbon layer is formed by a deposition method from hydrocarbon.

13. The method of claim 11, wherein the recessed sacrificial layer is removed by converting the recessed sacrificial layer into carbon dioxide.

14. The method of claim 13, wherein the recessed sacrificial layer is converted into carbon dioxide by applying ultraviolet light in an oxygen ambient.

15. The method of claim 13, wherein the recessed sacrificial layer is converted into carbon dioxide by applying heat in an oxygen ambient.

16. The method of claim 10, wherein
the second liner layer is made of silicon oxide, and
the first liner layer is made of silicon nitride.

17. A method of manufacturing a semiconductor device, comprising:
forming a space between conductive patterns, the space extending to a depth level equal to or deeper than bottoms of the conductive patterns;
forming a first liner layer in the space;
forming a sacrificial layer on the first liner layer;
recessing the sacrificial layer;
forming a second liner layer over the recessed sacrificial layer;
forming an air gap by removing the recessed sacrificial layer; and
forming a third liner layer over the second liner layer, at least a portion of the third liner layer being between the conductive patterns within the space,
wherein the third liner layer is made of at least one of silicon nitride, SiON, SiOCN, or SiCN.

18. The method of claim 17, wherein the conductive patterns are metal wiring patterns made of Cu or a Cu alloy.

19. The method of claim 17, wherein the conductive patterns are a first conductive pattern and a second conductive pattern including a different conductive material than the first conductive pattern.

20. The method of claim 17, wherein the sacrificial layer is a carbon layer.

* * * * *